United States Patent [19]

Gyorgy et al.

[11] 4,207,613

[45] Jun. 10, 1980

[54] BUBBLE DEVICE CONTAINING A FERRITE BIASING MAGNET

[75] Inventors: Ernst M. Gyorgy, Madison; Frank J. Schnettler, Harding Township, Morris County, both of N.J.

[73] Assignee: Bell Telephone Laboratories, Incorporated, Murray Hill, N.J.

[21] Appl. No.: 640,482

[22] Filed: Dec. 15, 1975

[51] Int. Cl.$^2$ .............................................. G11C 11/02
[52] U.S. Cl. .................................. 365/27; 252/62.56; 252/62.57; 252/62.58; 252/62.59; 252/62.63; 365/33; 428/539; 428/900
[58] Field of Search ............... 252/62.56, 62.57, 62.58, 252/62.59, 62.63; 340/174 TF; 428/539, 900; 365/27, 33

[56] References Cited

U.S. PATENT DOCUMENTS

| | | | |
|---|---|---|---|
| 3,197,412 | 7/1965 | Gyorgy et al. | 252/62.56 X |
| 3,711,841 | 1/1973 | Geusic et al. | 340/174 TF |
| 3,886,533 | 5/1975 | Bonner et al. | 340/174 TF |

OTHER PUBLICATIONS

Anastasyuk et al. I "Chem. Abstract", vol. 79, 1973, 84947f.
LeCraw et al. "Applied Physics Letters", 26, p. 402 (1975).
Anastasyuk et al. II "Chem. Abstracts," vol. 81, 1974, 142832u.
Bogdanovich et al. "Chem. Abstracts" vol. 79, 1973, 58530v.

Primary Examiner—Jack Cooper
Attorney, Agent, or Firm—Richard D. Laumann

[57] ABSTRACT

A ferrite material has been found that is useful for a biasing magnet whose magnetic field stabilizes single wall magnetic domains. The strong temperature dependence of the ferrite's magnetic field makes the ferrite especially useful when used with magnetic materials which require a highly temperature dependent magnetic field to maintain a constant domain or bubble size. The ferrite composition is represented by the formula $NiFe_{(1+x)}Cr_{(1-x)}O_4$, x is in the range between 0.04 and 0.18, and 1 percent to 10 percent, by weight, additional material selected from the group consisting of zirconium oxide, thorium oxide and hafnium oxide.

7 Claims, 5 Drawing Figures

BUBBLE DEVICE CONTAINING A FERRITE BIASING MAGNET

BACKGROUND OF THE INVENTION

1. Field of the Invention

This invention is concerned with magnetic bubble devices that include a layer a magnetic material supported on a generally nonmagnetic substrate. Such devices depend on the nucleation and/or propagation of enclosed single wall magnetic domains, having polarization opposite to that of the surrounding material in the supported layer, for their operation. Functions which these devices may perform include memory, switching, logic, etc.

2. Description of the Prior Art

In recent years, there has been interest in a class of magnetic devices known generally as bubble devices. These devices generally use a supported planar layer of material capable of manifesting uniaxial magnetic anisotropy and of supporting single wall magnetic domains, generally called bubbles. Although capable of assuming any one of several different configurations, bubbles are usually cylindrical with the direction of magnetization normal to the surface of the layer and opposite to that of the surrounding material in the layer. Materials capable of supporting bubbles include $Co_5Sm$ garnets, rare earth orthoferrites and magnetoplumbites.

A bubble is stable in most materials over a range of diameters that typically varies by a factor of three. As bubble size, at any temperature, depends on the magnetic field within the supported layer, a bias field is usually applied to obtain a bubble diameter in the middle of the range. Because the magnitude needed for the bias field depends upon the magnetization of the supported layer, which for most magnetic materials is temperature dependent, the bubble size will vary with temperature unless the bias field varies. If the size variations become extreme, the bubbles will disappear either through radial instability where the magnetic field is strong enough to collapse the bubbles or through elliptical instability where the magnetic field is not strong enough to prevent the bubbles from expanding into long (strip) domains. A temperature dependent range of bias field values in which bubbles are stable is thus defined. Within this range, it is desirable to maintain bubbles at a constant size. Bubbles are usually moved within the layer of supported material by overlay patterns of magnetically soft material and a time varying in plane magnetic field. Size variations may either cause variable coupling between the bubbles and the drive field and overlay patterns or increased domain interaction and lead to erratic propagation.

Although bubble materials can be produced with almost temperature independent characteristics including bubble size, for a temperature independent bias field, in general, the bubble size is a function of temperature unless the bias field has the temperature dependence that maintains the bubbles at constant size. It can be seen that if the bias field does not have the required temperature dependence, i.e., if it does not keep the bubbles at a reasonably constant size, the temperature range in which the bubble material may operate under optimum conditions will be restricted.

Bias magnet materials with a temperature dependent magnetic field that closely matches that needed to maintain a constant size bubble are known and have been used to expand the temperature range over which particular bubble devices are usefully operated. Some exemplary materials are discussed in U.S. Pat. No. 3,711,841 of J. E. Geusic and L. G. VanUitert.

Bubble materials have been recently developed, see Applied Physics Letters, 26 402 (1975), that appear to have significant advantages over prior materials because bubbles may be propagated in them at higher velocities than possible in prior materials before bubble propagation becomes erratic and information is lost. A high bubble velocity is desirable because a major contemplated use of bubbles is in memories in which bubbles are accessed sequentially and a high velocity reduces the time needed to access a particular bubble or absence thereof and retrieve that bit of information. The operating speed of the machine using bubble memories may thus be increased. These materials do, however, require a strongly temperature dependent magnetic bias field, approximately 0.6 percent/degree C. at 50 degrees C. to maintain the bubbles at constant size and permit operation over an extended temperature range.

As the bias field is usually supplied by a permanent magnet, the material used in the magnet should have those properties that are desirable in permanent magnets including, in a preferred form, a high coercive force. The material used for the magnet thus preferably satisfies two requirements if it is to be used advantageously with the bubble materials described above: (1) the temperature dependence of its magnetic field must be large compared to prior materials and (2) it preferably has a high coercive force.

SUMMARY OF THE INVENTION

A magnetic device that may be used for memory purposes and includes a substrate supporting a layer of material capable of supporting local enclosed regions having magnetic polarizations opposite to that of the material in the surrounding layer and which depends on the nucleation and/or propagation of such enclosed regions (bubbles) for its operation is described. The substrate supporting the layer may be made from a composite material. The device includes permanent magnet means for magnetically biasing the supported layer of material to stabilize the size of the bubbles, means for positioning the bubbles within the layer and means for propagating the bubbles within the layer. The composition of the permanent magnet is represented by the formula $NiFe_{(1+x)}Cr_{(1-x)}O_4$, x is within the range between 0.04 and 0.18, and in a preferred form an additional material selected from the group consisting of zirconium oxide, thorium oxide and hafnium oxide in an amount up to 10 percent by weight of the initial material and preferably at least 1 percent. It is believed that most of the latter material does not enter into the lattice and increases the coercive force by impeding domain wall motion. The included compositions are characterized by a highly temperature dependant magnetic field and a high coercive force. The temperature dependence of the magnetic field makes the compositions especially useful for use in conjunction with materials that have a highly temperature dependent range of magnetic field values in which bubbles are stable.

DETAILED DESCRIPTION

A garnet material, desirable for bubble devices because of a high limiting bubble velocity, but having highly temperature dependent characteristics and thus exemplary of materials suitable for use with biasing magnets using the materials of this invention is described in Applied Physics Letters 26 402 (1975). Garnets are of the general stoichiometry $Y_3Fe_5O_{12}$ and are ferrimagnetic with the net moment due to the predominance of three iron ions in the tetrahedral sites. The remaining iron ions are in octahedral sites. Y signifies a rare earth element which is present in the dodecahedral sites. The spins of the iron ions in the two sublattices are oppositely aligned to yield a net magnetic moment. The particular compositions discussed are representative of a larger class of materials that may be represented by the formula $Eu_xCa_yRE_{3-x-y}(A)_zFe_{5-z}O_{12}$ in which RE is yttrium, lanthanum or a rare earth selected from the lanthanide series with atomic numbers in the ranges 58–62 and 64–71 and A is selected from the group consisting of Si, Ge, Ga and V. X is at least 0.5, z is from 1.0–1.2 where A is Si, Ge, or V or a combination, z is from 1.2–1.5 where A is Ga, Y is essentially equal to z where A is Si, Ge or a combination thereof and is equal to 2z where A is V. A, the diamagnetic substitute goes into the tetrahedral sites and is added in quantities sufficient to reduce the net magnetization of the antiferromagnetically coupled iron sublattices to almost zero. Ca is added to obtain proper valence balancing and Eu is added in quantities sufficient that at least 75 percent of the net moment is due to Eu.

With the net magnetization of the iron sublattices being almost zero, the major contribution to the magnetization of the material comes from the Eu in the dodecahedral sites. A small net magnetization of the iron sublattices also means that the total g factor of the material may become very large as it is dominated by the Eu constituent which has a $J=0$ ground state and a large g factor. The g factor is simply the gyromagnetic ratio and is given by the ratio of magnetic moment to angular momentum. Consequently large g factors greater than 30 may be obtained in this material.

A large g factor is desirable because the limiting bubble velocity is proportional to the g factor. At the limiting or critical bubble velocity, bubble propagation becomes erratic and information is lost. Consequently, high bubble velocities are not possible. An increase in g factor thus increases the limiting bubble velocity. In the described material, bubble velocities over 60,000 cm/sec have been observed in contrast with limiting bubble velocities in typical low g materials of only several thousand cm/sec.

Figure 1:
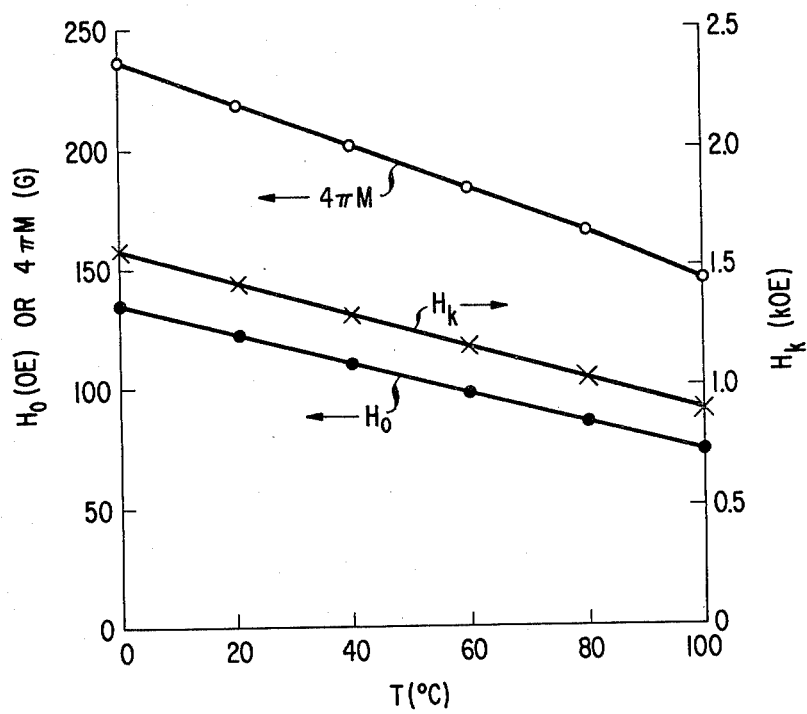
FIG. 1 shows the temperature dependence of the collapse field Ho, the magnetization $4\pi M$ and the anisotropy field Hk of a typical bubble material used with a bias magnet made from the material of the invention.

In FIG. 1, the temperature dependence of the anisotropy field Hk, the magnetization $4\pi M$ and the collapse field Ho are plotted for the high g garnet material for temperatures between 0 degrees C and 100 degrees C. It can be seen that all are highly temperature dependent. In particular it can be seen that the collapse field, i.e., the magnitude of the bias field at which the domains become radially unstable and collapse has a temperature variation of about 0.6 percent/degree C. at 50 degrees C. In comparison, a typical garnet film with a comparable Curie point, 466 degrees K., has a temperature dependence of the collapse field of only 0.2 percent/degree C.

The high temperature dependence of the collapse field requires the application of a bias field having a similar temperature dependence if this type of bubble material is to be used as wide a temperature range as possible without either the bubbles becoming radially or elliptically unstable or varying significantly in size. Although biasing magnets using materials with some temperature dependence are known and have been used to extend the operating temperature range of bubble materials, the materials heretofore used for biasing magnets are not suitable for the above described garnet bubble material because the known materials have a magnetic field with a limited temperature dependence typically 0.2 percent degrees C.

Figure 2:
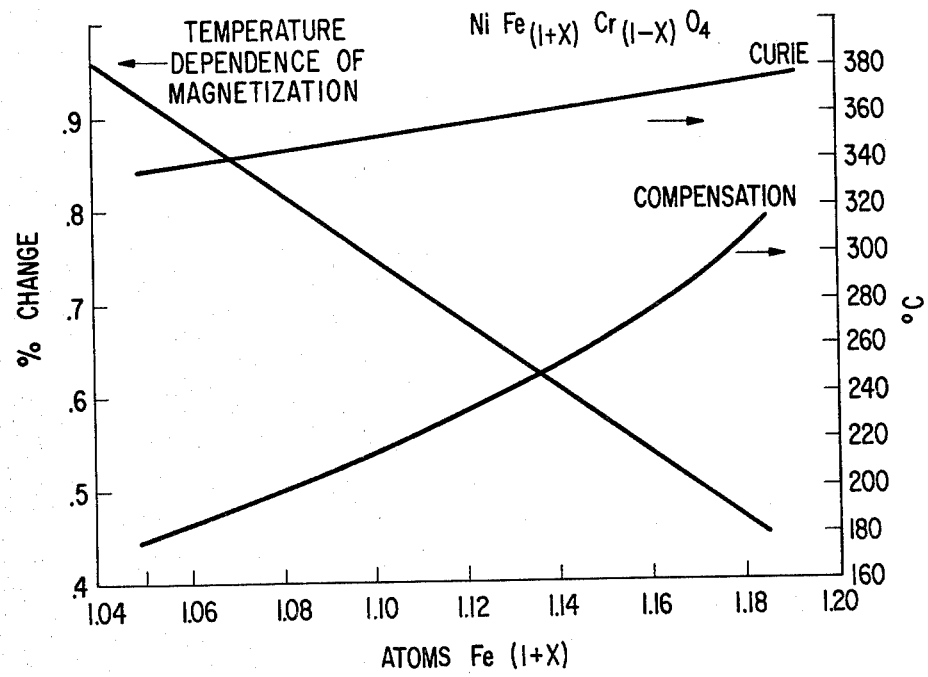
FIG. 2 shows the variation in the temperature dependence of the magnetic field, Curie point and compensation point with changes in the iron concentration in compositions of this invention.

Materials included within the invention are ferrites with a composition represented by the formula $NiFe_{(1+x)}Cr_{(1-x)}O_4$. The percentage temperature dependence of the magnetization and the variation in temperature of both the Curie point and the compensation point are plotted in FIG. 2 for changes in x. It can be seen that the temperature dependence is very high, and that the temperature dependence of magnetization and compensation point depend critically upon the value of x selected. Within the range of x shown, i.e., from 0.04 to 0.18, a magnetization with a temperature dependence varying from 0.92 percent/degree C. to 0.48 percent/degree C. at 50 degrees C. may be selected with the higher temperature dependence occuring for lower compensation points. This rapid variation with changes in x permits selection of the precise temperature dependence needed to match that of the bubble material. The limits on x give a variation in temperature dependence sufficient to match the temperature dependence of the high g materials over the contemplated operating range.

In a preferred form, the coercive force is further increased by adding small particles of a material that do not go into the ferrite lattice structure but form a discrete phase. Addition of particles to increase the coercive force of a ferrite is discussed in U.S. Pat. No. 3,197,412 to E. M. Gyorgy and F. J. Schnettler. These particles act to impede domain wall motion by making it energetically unfavorable for the domain walls to move past the particles. Impeding domain wall movement increases the coercive force because it becomes more difficult for the magnetizations of the domains to change. Materials that may be added include zirconium oxide, hafnium oxide and thorium oxide. The precise size of the particles is not critical although they are preferably submicron in size. If the particles are less than 500 Angstroms, they may be too small to impede domain wall motion and are thus undesirable. The quantity of material added is typically from 1 percent to 10 percent by weight of the initial ferrite material. Coercive forces of several hundred oersteds may be obtained.

EXAMPLE

A garnet film with the composition $Eu_{1.45}Y_{0.45}Ca_{1.1}Fe_{3.9}Si_{0.6}Ge_{0.5}O_{12}$ has been successfully used in a bubble device. It has a high limiting bubble velocity attributable to a g factor greater than 30 and a temperature dependence of the collapse field equal to −0.58 percent/degrees C. at 50 degrees C. It can be seen from FIG. 2, that a value of x within the range 0.13 to 0.16, and preferably centered therein, gives a temperature dependence for the magnetization of a biasing magnet using the described ferrite material that is very close to that of the bubble material and for $x=0.14$ is essentially equal to −0.58 percent/degrees C. at 50 degrees C. Satisfactory operation of a bubble device using the above garnet composition has been achieved within the temperature range extending from 23 degrees C. to 100 degrees C. with a bias magnet using the described ferrite material and with x essentialy equal to 0.14.

The ferrite material may be processed by any of a variety of ferrite forming techniques. Generally the conventional mixing calcium-grinding-firing sequence is suitable.

Figure 3:
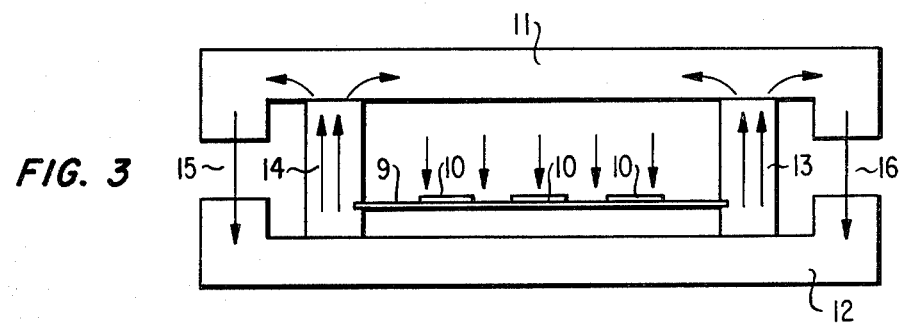
FIG. 3 shows a suitable configuration for a bias magnet.

A cross-sectional view of a suitable structure for a permanent magnet to bias the layer of bubble material to stabilize the bubbles and using the materials of the invention is shown in FIG. 3. The magnet structure provides an essentially uniform magnetic field over the entire layer 10 of bubble material supported by substrate g. The magnet has high permeability end plates 11 and 12 that are typically made of permalloy and ferrite plugs 13 and 14 made from the above-described ferrite composition. The separation between end plates 11 and 12 is controlled by, for example, a screw adjustment that varies the spacing between the end plates 11 and 12. The arrows in the figure represent flux lines and illustrate a uniform magnetic field within the area bounded by plugs 13 and 14. The magnetic field intensity is adjusted, e.g., with a screw adjustment, to the desired value by changing the size of air gaps 15 and 16.

Figure 4:
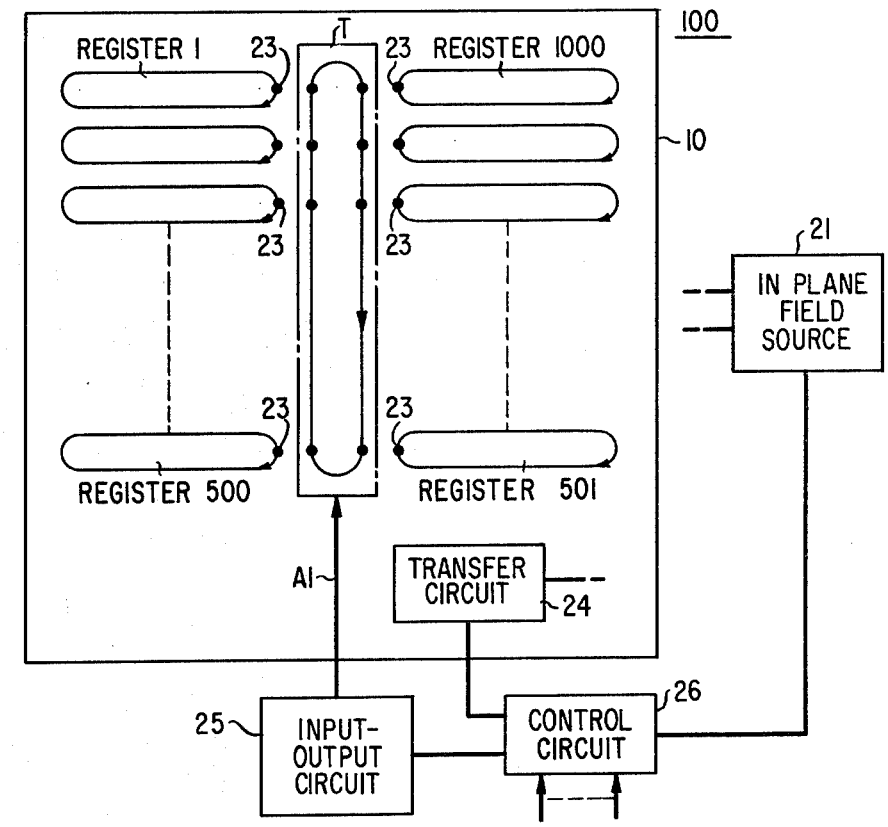
FIG. 4 is a schematic of a memory in accordance with this invention.

The device schematically shown in FIG. 4 is illustrative of the class of bubble devices in which switching, memory and logic functions depend on nucleation and-/or propagation of single wall magnetic domains. Arrangement 100 includes a supported layer of material 10 in which bubbles may be moved. Bubble movement and positioning is controlled by patterns of magnetically soft overlay material and a rotating in plane field. The overlays may be T and bar shaped segments, not shown, although other patterns can be used. The in plane field source is represented by block 21.

The horizontal closed loops are separated into right and left banks by a vertical closed loop T, indicated by registers 501–1000 and 1–500, respectively. The horizontal and vertical loops are conventionally called minor and major loops, respectively. The bubbles move clockwise within each loop as the in plane field moves clockwise. The bubbles move simultaneously in all loops as synchronized by the in plane field. Each rotation of the in plane field advances the bubbles to the next position in each loop.

In usual operation, the minor loops are occupied and the major loop is unoccupied, i.e., the minor loops are used for storage and the major loops for input-output functions. A word formed by the bits represented by the bubbles occupying positions 23 is suitably positioned for transfer into the major loop. Transfer to the major loop is controlled by a transfer circuit represented by block 24.

After transfer to the major loop, the information moves to a read/write position represented by arrow A1, and connected to a read-write (input-output) circuit 25 and controlled by control circuit 26. This movement is in response to the rotation of the in plane field. A read or write operation is under control of control circuit 26.

Read or write operations thus result in the transfer of bubbles from the minor loop to the major loops or vice versa. The information transfer is controlled by the rotation of the in plane field.

Figure 5:
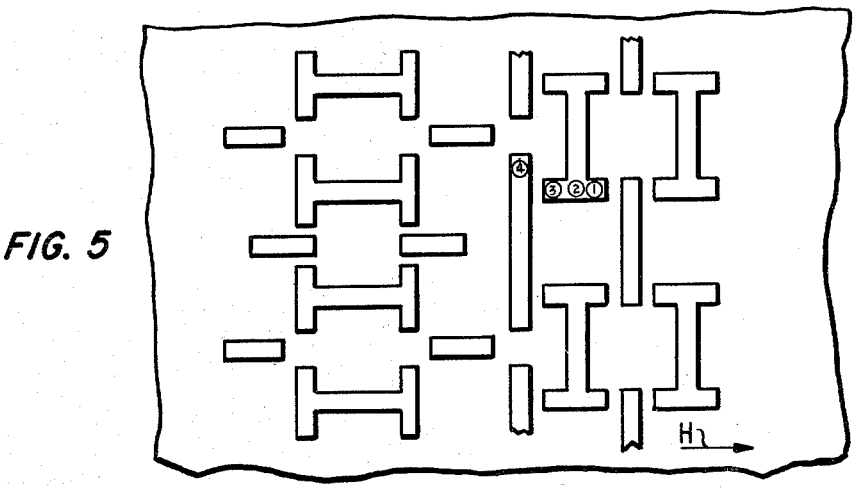
FIG. 5 shows a configuration of magnetic overlays to be used with portions of the memory of FIG. 4 and locations of domains during operation of the memory.

The overlay pattern contains repetitive segments as shown in FIG. 5. Alignment of the rotating in plane field with the long dimension of an overlay segment induces poles in the end portions of that segment. Assuming that the field is initially oriented as indicated by arrow H and that positive poles attract domains, one cycle of the rotating in-plane field, thought of as having four phases, moves a bubble consecutively to the positions represented by numerals 1, 2, 3 and 4 in FIG. 5, which are occupied by positive poles as the rotating field comes into alignment with those positions. The domain patterns in the channels correspond to the repeat pattern of the overlay, i.e., next adjacent bits are spaced one repeat pattern apart. The positions illustrated show a bubble in position 4 ready for transfer from a minor loop to the major loop. Write operations are the inverse of read operations with bubbles, representing the bits of a word, being placed in the major loop by read-write circuit 25 and then transferred into the minor loops. Details of the read-write operations and bit or bubble transfers from the major loop to the minor loops and vice versa are discussed in *Magnetic Bubbles* by A. H. Bobeck and E. Della Torre (North Holland Publishing Co. 1975).

What is claimed is:

1. A device comprising a substrate supporting an epitaxial layer, said layer being capable of evidencing uniaxial magnetic anisotropy capable of supporting local enclosed regions of magnetic polarization opposite to that of material surrounding said local regions, said epitaxial layer being represented by the formula $Eu_w Ca_y RE_{3-w-y}(A)_z Fe_{5-z}O_{12}$, in which RE is yttrium, lanthanum, or a rare earth selected from the lanthanide series of element numbers 58–62 and 64–71 of the Periodic Table; in which A is at least one element selected from the group consisting of Si, Ga, Ge, Al, and V; w is at least 0.5; z is from 1.00–1.20 where A is Si, Ge, or V, or a combination thereof and z is from 1.20–1.50 where A is Ga; in which y is essentially equal to z where A is Si, Ge, or a combination thereof and is equal to 2z where A is V, means for magnetically biasing said layer to stabilize said enclosed regions, means for positioning said enclosed regions within said layer, means for propagating said enclosed regions within said layer, characterized in that the composition of the material of said means for magnetically biasing is represented by the formula $NiFe_{(1+x)}Cr_{(1-x)}O_4$ with 0 to 10 percent by weight additional material selected from the group consisting of zirconium oxide, thorium oxide and hafnium oxide, and x is from 0.04 to 0.18.

2. A memory device as recited in claim 1 wherein the material of said magnetically biasing means contains 1 percent to 10 percent by weight additional material selected from the group consisting of zirconium oxide, thorium oxide and hafnium oxide.

3. A memory device as recited in claim 2 in which said epitaxial layer is represented by the formula $Eu_{1.45}Y_{0.45}Ca_{1.1}Fe_{3.9}Si_{0.6}Ge_{0.5}O_{12}$.

4. A memory device as recited in claim 3 in which x is from 0.13 to 0.16.

5. A memory device as recited in claim 1 in which x is from 0.13 to 0.16.

6. A memory device as recited in claim 1 in which said epitaxial layer is represented by the formula $Eu_{1.45}Y_{0.45}Ca_{1.1}Fe_{3.9}Si_{0.6}Ge_{0.5}O_{12}$.

7. A memory device as recited in claim 6 in which x is from 0.13 to 0.16.

* * * * *

UNITED STATES PATENT AND TRADEMARK OFFICE
CERTIFICATE OF CORRECTION

PATENT NO. : 4,207,613
DATED : June 10, 1980
INVENTOR(S) : Ernst M. Gyorgy and Frank J. Schnettler It is certified that error appears in the above—identified patent and that said Letters Patent is hereby corrected as shown below:

In the Specification, Column 1, line 8, "a", second occurrence, should read --of--. Column 3, line 34, "Ge" should read --Ga--; line 59, "high" should read --higher--. Column 4, line 13, after "used" should read --over--.

Signed and Sealed this

Seventh Day of October 1980

[SEAL]

Attest:

SIDNEY A. DIAMOND

Attesting Officer

Commissioner of Patents and Trademarks